United States Patent [19]

Benbow

[11] 4,072,267

[45] Feb. 7, 1978

[54] METER ENCODING REGISTER HAVING AN IMPROVED POINTER SHAFT ASSEMBLY

[75] Inventor: Eugene C. Benbow, Raleigh, N.C.

[73] Assignee: Westinghouse Electric Corporation, Pittsburgh, Pa.

[21] Appl. No.: 669,547

[22] Filed: Mar. 23, 1976

[51] Int. Cl.² .............................................. G06C 27/00
[52] U.S. Cl. .............................. 235/112; 235/144 SD
[58] Field of Search ............................... 235/108–114, 235/144 R, 144 DM, 144 M, 144 S, 144 SS, 144 SM, 144 SP, 144 MA, 144 EA

[56] References Cited

U.S. PATENT DOCUMENTS

| 451,756 | 5/1891 | Cloudsley | 235/109 |
| 2,147,895 | 2/1939 | Hamill | 235/112 X |
| 3,441,923 | 4/1969 | King | 340/188 R |

*Primary Examiner*—Lawrence R. Franklin
*Attorney, Agent, or Firm*—R. W. Smith

[57] ABSTRACT

A meter encoding register includes pointer shaft assemblies associated with each of a plurality of dials provided in the register. The shaft assemblies are rotationally interconnected to each other and to a meter movement drive through friction clutch couplings. Slippage at the clutches permits reorientation of one shaft assembly independently of the other shaft assemblies while maintaining the dial pointer and code pattern in fixed shaft positions.

4 Claims, 3 Drawing Figures

METER ENCODING REGISTER HAVING AN IMPROVED POINTER SHAFT ASSEMBLY

BACKGROUND OF THE INVENTION

Encoding of meter readings for use in remote meter reading and telemetry systems are well known. In remote utility meter reading systems, encoding at the meter permits the electrical signal representation to be compared to the register dial reading at the meter site. The registers provide a totalizing or accumulating of the consumption of a measured quantity, such as kilowatt hours of electrical energy in a watthour meter, by converting the sum of rotations of a meter shaft into calibrated dial readings. The angular positions of each of the dial pointer shafts are converted into an electrical binary or digital signal. Watthour meter registers are typically provided with four or five dials each having an associated pointer shaft which is driven by a gear train system from the rotating metering movement. The five dials, for example, have readings in units, tens, hundreds, thousands and ten-thousands of the quantity to be measured, for example, kilowatt hours. The register has a predetermined ratio constant which is related to the consumption of the quantity to be measured and the rate of rotation of the metering movement.

In patent application Ser. No. 645,165, filed Dec. 30, 1975 and assigned to the assignee of this invention, there is disclosed and claimed an opto-electronic meter register encoder wherein a pattern disc is mounted to each of a plurality of pointer shafts. The pattern discs actuate photosensitive pickups to produce a plural bit binary code representation of the angular position of each pointer shaft. In accordance with the known construction of meter registers, the pointer shafts are interconnected by gearing so as to have a predetermined ratio such as a ratio of 1 to 10. In a five dial decade register the unit's dial will rotate ten-thousand times for a one-tenth incremental rotation of the ten-thousands dial. The thousands, hundreds and tens dials will be moved proportionally less along with movement of the lowest and highest order dials.

In the manufacture and maintenance of the meter encoding registers it is necessary to precisely establish and maintain the position of each pattern disc relative to each pointer shaft with which it is associated. The pattern discs are assembled to the shafts which are then assembled into the register gear train system. Finally, the pointers are oriented on the ends of the pointer shafts with respect to the position of the code disc and the dial indicating position of the pointer.

During manufacture it may be necessary to test and adjust the code discs so that they produce the appropriate electronic coded signal output for indicating the dial position of the shaft and pointer. Although the pointer may be shiftable on the pointer shaft it is usually desirable to fix the position of the pointer on the shaft so that thereafter no readjusting the code pattern occurs relative to the shaft and pointer. When it is necessary to test each of the register pointer shafts at each encoded dial position, substantial wear and extensive movement occurs in the lower decade order dial shafts when the higher and highest order dial shafts are rotated through the various dial positions. Also, with a fixed relationship established in the register gear train it is impossible to adjust one shaft independently of the other pointer shafts.

The present invention is directed to the aforementioned difficulties and disadvantages in manufacturing, testing and maintaining meter encoding registers made in accordance with the prior art arrangements.

SUMMARY OF THE INVENTION

In accordance with the present invention, a plural dial meter encoding register includes an improved pointer shaft assembly for mounting code discs relative to predetermined pointer positions and for independently uncoupling each shaft assembly. A driving input to each one of the pointer shafts is provided through a clutch coupling having a predetermined torque transmission limit while the intershaft gear systems provide a predetermined dial ratio. When torque is applied to an individual pointer shaft which exceeds the predetermined clutch driving torque, independent adjustment of the pointer shaft is permitted relative to the other pointer shafts of the register.

It is a general feature of the present invention to provide a simple reliable and efficient manner of mounting code discs on the pointer shafts of a meter encoding register while providing clutch drive couplings to cooperatively drive the pointer shafts in unison at predetermined gear ratios from a metering movement and to maintain independent adjustment and reorientation of a given pointer shaft relative to the other shafts of the register. It is a further feature of the present invention to provide a simple friction clutch coupling at the driving input of a pointer shaft to frictionally drive the pointer shaft in response to metering movement. A still further important feature of the present invention is to provide a meter encoding register having an improved shaft assembly for releasably coupling the respective pointer shafts together in a simple reliable arrangement having the same reliability over extended usage in various adverse conditions as is normally provided in construction of registers for use in utility metering.

DESCRIPTION OF THE PREFERRED EMBODIMENT

Figure 1:
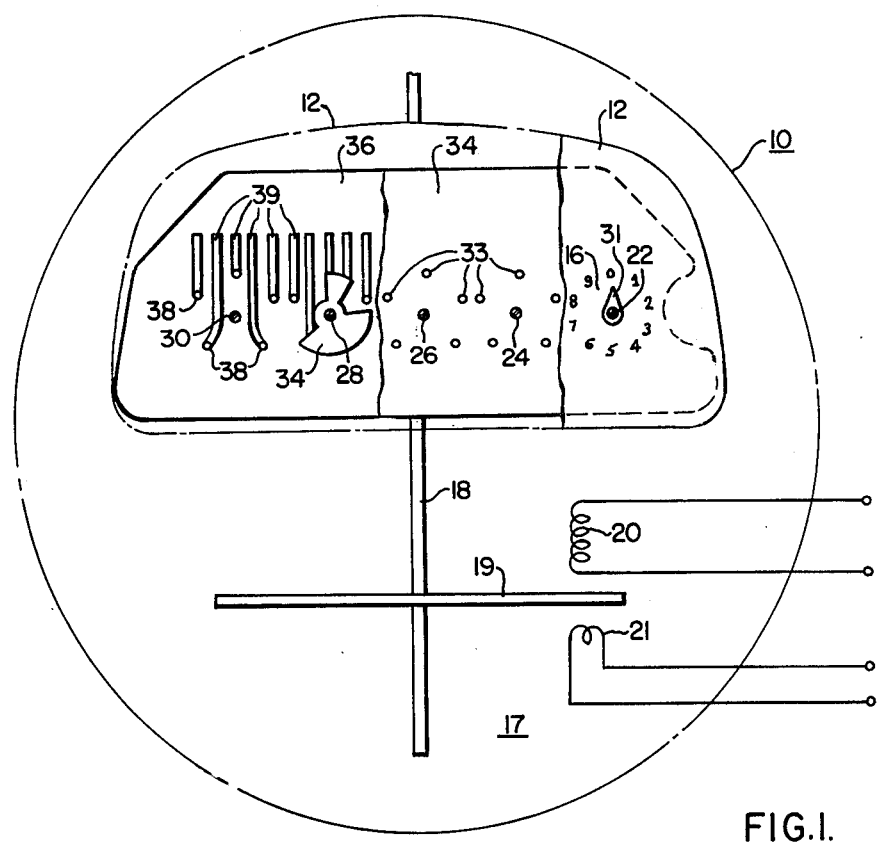
FIG. 1 is a front plan view with parts broken away of a meter encoding register made in accordance with the present invention.

Referring now to the drawings and more particularly to FIG. 1 there is shown a front plan view with parts broken away of a plural dial meter encoding register 10 made in accordance with the present invention. The meter encoding register 10 is an opto-electronic type substantially as disclosed in U.S. patent application Ser. No. 645,165 filed Dec. 30, 1975, and assigned to the assignee of this invention, with the additional improvement of the invention as disclosed herein. The register 10 generally includes a front dial plate 12 having five decade related dials, the units dial 16 being shown at the right-hand side of the dial plate 12. The dials indicate numerical meter readings of measured kilowatt hours produced by the metering movement of a watthour meter 17. The metering movement typically includes a shaft 18, coupled to the register 10, and a disc 19 electromagnetically driven by magnetic fluxes produced by voltage and current coils 20 and 21. Circularly disposed numerals "0" through "9" define each of the dials on the dial plate 12. The dials are progressively ascending in the clockwise direction on alternate dials beginning with the right-hand units dial and the two remaining alternate dials are progressively ascending in a counterclockwise direction as described in the aforementioned U.S. patent application Ser. No. 645,165.

Pointer shafts 22, 24, 26, 28 and 30, described in detail in connection with the description of FIG. 2, extend in parallel relationship to each other. The pointer shafts are oriented so as to extend through the center axis of each of the register dials. The pointer 31 of the dial 16 is shown on the forward end of shaft 22. Immediately behind the dial plate 12 is a light guide assembly 32, described in detail in the aforementioned patent application Ser. No. 645,165 including point light sources 33 formed in the light guide material of the plate 32. Each of the pointer shafts also carries a code pattern disc and a disc 34 is shown as it is assembled to the shaft 28 between the light guide plate and a circuit board 36 mounted rearwardly of the light guide plate 32. The circuit board 36 carries opto-electronic sensors 38 connected by printed circuit conductors 39 to electronic circuits associated with the encoding circuitry of the register 10. The opto-electronic sensors 38 are aligned with the point light sources 33 so as to give a five bit binary code output responsive to the position of the associated code disc such as disc 34. The general arrangement of the register 10 of FIG. 1 is in accordance with the description of the invention as also described in detail in the aforementioned U.S. patent application.

Figure 2:
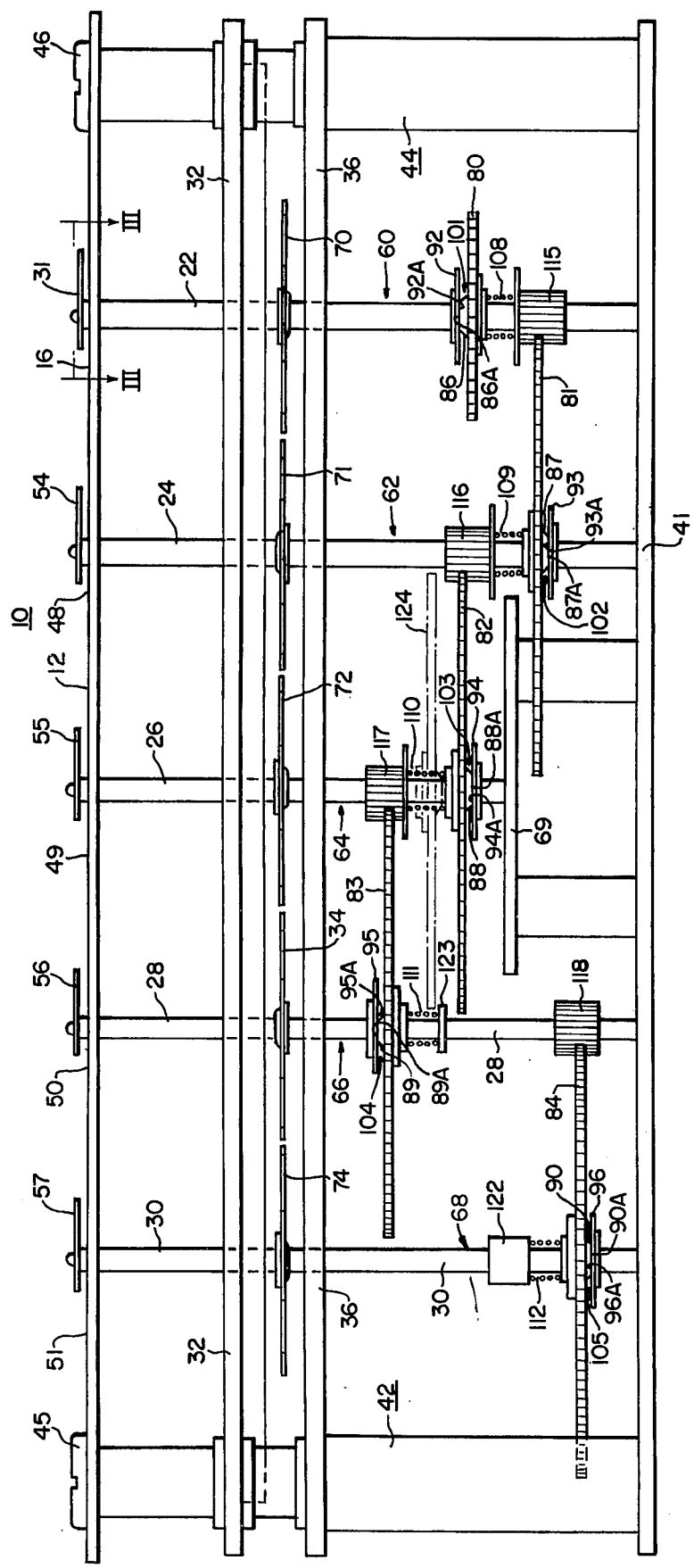
FIG. 2 is a bottom plan view of the register assembly shown in FIG. 1.

Having described the general features of the meter encoding register 10, reference is now made to FIG. 2 wherein is shown a detail bottom plan view of the register 10. The dial plate 12, light guide plate 32, circuit board 36 and a back plate 41 are held together by posts including post 42 and 44 and screws 45 and 46 threaded into the ends of the posts as shown. The pointer shafts 22, 24, 26, 28 and 30 extend through the dial plate 12 at the center of units, tens, hundreds, thousands and ten-thousands dials 16, 48, 49, 50 and 51, respectively, provided on the face of the dial plate 12. The numerals 48, 49, 50 and 51 indicate the dials corresponding to the dial 16 of FIG. 1 wherein dials 48 and 50 read counterclockwise. The pointer shafts 24, 26, 28 and 30 include dial pointers 54, 55, 56 and 57 like the pointer 31. Improved pointer shaft assemblies 60, 62, 64, 66 and 68 include the shafts 22, 24, 26, 28 and 30, respectively, and the assemblies include substantially identical features in accordance with this invention; however, they have different configurations to accommodate the space and operation of the shaft assemblies within the register 10. The opposite ends of shafts 22, 24, 28 and 30 are journaled in the plates 12 and 41 with the shorter shaft 26 journaled in plate 12 and an intermediate plate 69. In addition to the code disc 34, shown assembled to the shaft 28 in FIG. 1, code discs 70, 71, 72 and 74 are fixedly assembled to the shafts 22, 24, 26, and 30, respectively. Each of the assemblies includes large diameter input gears 80, 81, 82, 83 and 84 included in the register gear train system. The gear 80 is driven from gears directly coupled to the rotating electro-magnetically responsive movement of the watthour meter 17.

The gears 80, 81, 82, 83 and 84 are each large diameter gears having 140 teeth and an outside diameter of about 1.14 inch (2.9 cm). Each of the input gears is rotatable and slidable on the associated shaft and includes a hub 86, 87, 88, 89 and 90 having flat annular radial end surfaces 86A, 87A, 88A, 89A and 90A, respectively. Axially adjacent each of the input gear hubs on the pointer shafts are retaining rings 92, 93, 94, 95 and 96 fixedly mounted to the shafts 22, 24, 26, 28 and 30, respectively. The aforementioned retaining rings include flat annular radial surfaces 92A, 93A 94A, 95A and 96A frictionally engageable by the adjacent radial surfaces of the input gear hubs.

Friction clutch couplings 101, 102, 103, 104 and 105 are formed by the mutually engaging surfaces 86A–92A, 87A–93A, 88A–94A, 89–95A, and 90A–96A. The input gears 80, 81, 82, 83 and 84 with the associated hubs define the driving member or portion of the clutch couplings 101, 102, 103, 104 and 105, respectively. The retaining rings 92, 93, 94, 95 and 96 form the driven member or portion of the clutch couplings. Coil springs 108, 109, 110, 111 and 112 axially bias the input gears so that the hub clutch surfaces frictionally engage the mating clutch surfaces of the retaining rings with a predetermined axial force which establishes the pressure of the surfaces on each other. A predetermined torque limit is established which can be applied between a shaft and the input gear. The predetermined limiting clutch transmitting torque is such that the normal metering movement driving torque is applied or coupled to the input gears during normal metering operation of the register 10.

The driven clutch portions are rotationally uncoupled from the driving clutch portions when the torque developed thereacross exceeds the predetermined limit whereupon one of the engaging surfaces slides or slips over the other engaging surface. Pinion gears 115, 116, 117, 118 are fixedly mounted to the shafts 22, 24, 26 and 28 to form shaft output gears having an outside diameter of approximately 0.15 (0.38 cm) inch with 14 gear teeth for meshing with the large diameter gears of the left-hand adjacent shafts as shown in FIG. 2. Accordingly, the pointer shafts 22, 24, 26, 28 and 30 are rotated at a ratio of one to ten from the right-hand shaft 22 progressively to the shafts 24, 26, 28 and 30. The coil springs 108, 109, 110 and 111 are axially positioned between the associated pinion gear and input gear as shown on the gears 22, 24, 26 and 28. Cylindrical sleeves 122 and 123 are fixedly mounted to the pointer shafts 30 and 28 in axially spaced relationship to the input gears 84 and 83 so that the coil springs 111 and 112 exert resilient clutch torque limiting forces against the gear 84. The slippage torque at the clutch surfaces is controlled by the friction engaging characteristics of the hub and retaining ring mating surfaces and the force exerted thereon by the shaft coil springs.

The input gear 82 is shown in the alternate position indicated by the broken lines 124 for illustrating that each of the input gears can be axially moved along the associated pointer shaft against the resilient bias force of the associated coil spring such as coil spring 110. This releasably separates the driving clutch coupling between the input gear 82 and retaining ring 94. If the input gear 83 is similarly retracted from engagement with the retaining ring 95, the shaft 26 may be rotated independently on the adjacent and remaining pointer shafts of the register 10. Advantageously, in accordance with the present invention, a pointer shaft, subjected to an external or manual torque above the slipping or predetermined torque limit at the associated clutch coupling, will rotate independent of the other pointer shafts. No torque is applied to the large input gear carried by the turned shaft because of the clutch slippage and the excess torque will be applied through the output pinion gear of the turned shaft to cause slippage at the clutch coupling at the input gear of the next higher order dial pointer shaft. This permits the independent shaft rotation without the aforementioned axial displacement of an input gear.

Figure 3:
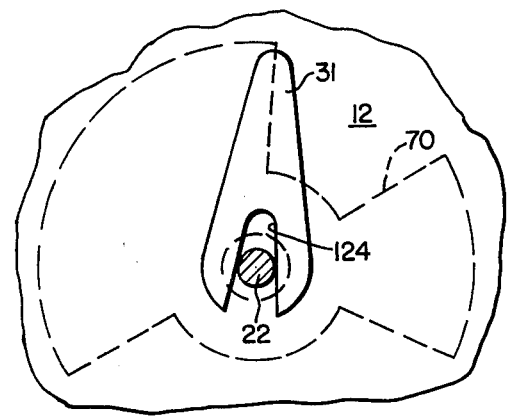
FIG. 3 is a fragmentary view taken along the axis III—III in FIG. 2 and looking in the direction of the arrows.

The final step in manufacture of the register 10 includes the mounting of the pointers 31, 54, 55, 56 and 57 on the forward reduced diameter ends of the shafts 22, 24, 26, 28 and 30, respectively as shown in FIG. 3. It is important that the pointers be oriented precisely on the pointer shafts in alignment with the code pattern discs 70, 71, 72, 34 and 74. In FIG. 3 is shown the mounting of the pointer 31 on the pointer shaft 22 with respect to the associated code disc 70. The outline of the disc 70 is shown in broken lines. The pointer 31 includes one typical manner of mounting and attaching the dial pointers to the forward ends of the pointer shafts by a split portion 124 extending into the rearward end of the pointer 31. The spacing of the sides of the split opening 125 provides an interference fit with the reduced end of the pointer shaft so that the pointer 31 is mounted in a frictionally engaging relationship to the shaft due to the resilient gripping of the sides of the opening to the reduced shaft end. The engagement of the pointer 31 on the shaft end is such that it is possible to turn the pointer with sufficient torque to exceed the slipping torque at the clutch coupling. The pointer will not move relative to the code disc during repositioning of the associated shaft independently of the other shafts as described hereinabove. It is also possible by holding the shaft 26 in a fixed position to reorient the pointer relative to the code disc 70, however, it is normally desired to maintain fixed shaft orientations for the pointer and code disc. It is further contemplated that the pointer 31 can be permanently attached to the pointer shaft outer end such as by welding or a suitable adhesive to maintain a fixed relationship between the pointer 31 and code disc 70. The alignment of the pointers relative to the code shafts are as described in the aforementioned U.S. application Ser. No. 645,165 so that the binary coded output produced at the opto-electronic sensors associated with each shaft corresponds to the numerical indication of the pointer dial position. The pointer position is established by the angular position of the pointer shaft upon being driven from the metering movement.

Accordingly, the improved meter encoding register having the pointer shaft assemblies as described hereinabove affords a simple reliable means for assembling and maintaining the encoding register so as to reduce unnecessary wear on the register gear train when reorienting the shafts having the associated code disc. It is to be understood that while a preferred embodiment of the present invention as disclosed herein other modifications and embodiments may be made within the spirit and scope of this invention.

I claim:

1. A plural dial meter encoding register for a utility meter having a rotating metering movement and including plural pointer shaft assemblies each associated with a separate register dial wherein said plural pointer shaft assemblies comprise:

plural shaft members each having a forward end carrying a pointer for an associated register dial;

plural code patterns each carried in a fixed relationship on a separate shaft member in a fixed encoding relationship with a pointer of the same shaft member;

plural input gears each mounted for rotational and axial movements on a separate one of said plural shaft members, and plural output gears fixedly attached to each of said plural shaft members excepting a last one of the shaft members for continuously meshing with said input gears during the rotational and axial movements thereof, said input and output gears rotationally and progressively interconnecting said plural shaft members with said metering movement for concurrently rotating said plural shaft members at different predetermined rates of rotation in response to rotation of said metering movement;

plural clutch members each including a driving portion and a driven portion, each of said driven portions being fixedly mounted to an associated shaft member, each of said driving portions carried on one of said plural input gears, said driving and driven portions having releasably engaging torque transmitting surfaces for coupling and uncoupling rotational movement therebetween when said input gears are axially shifted toward and away from the clutch driven portions respectively, and when the torque on one of the clutch portions is less than and more than a predetermined torque limit, respectively, such that the maximum torque applied from said metering movement during the measuring operation thereof is less than said predetermined torque limit, and further such that an externally applied torque on one of said plural shaft members in excess of said predetermined torque limit effects rotation of the one shaft member and the associated code pattern and pointer independently of any other of said plural shaft members.

2. A meter encoding register as claimed in claim 1 wherein each of said input gears includes a hub portion having an annular end part defining one of the mating torque transmitting surfaces and said driven portion includes an annular part rotatable with the associated shaft member in facing relationship with the input gear hub portion so as to define the other of the mating torque transmitting surfaces.

3. A meter encoding register as claimed in claim 2 wherein said driven portion of each of said plural clutch members includes a retaining ring member, and wherein each of said plural shaft members carries a coil spring resiliently biasing said input gear of each of said plural gear means toward said retaining ring member whereby the mating torque transmitting surfaces of each clutch member frictionally engage each other with a predetermined axial force established by the associated coil spring member.

4. A meter encoding register as claimed in claim 3 wherein each of said plural code patterns includes a disc including an optically encoded pattern operable to produce different encoded representations at opto-electronic sensors in response to different angular positions of the associated shaft member.

* * * * *